United States Patent
Lee

(10) Patent No.: US 7,270,934 B2
(45) Date of Patent: Sep. 18, 2007

(54) WATER-SOLUBLE NEGATIVE PHOTORESIST POLYMER, COMPOSITION CONTAINING THE SAME, AND METHOD OF FORMING A PHOTORESIST PATTERN

(75) Inventor: Geun Su Lee, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 10/999,412

(22) Filed: Nov. 30, 2004

(65) Prior Publication Data
US 2005/0282079 A1   Dec. 22, 2005

(30) Foreign Application Priority Data
Jun. 18, 2004   (KR) ................ 10-2004-0045553

(51) Int. Cl.
G03F 7/00   (2006.01)
G03F 7/004  (2006.01)

(52) U.S. Cl. ............... 430/270.1; 430/281.1; 430/286.1; 430/311

(58) Field of Classification Search .......... None
See application file for complete search history.

(56) References Cited

U.S. PATENT DOCUMENTS

| | | | |
|---|---|---|---|
| 4,925,913 A * | 5/1990 | Teramoto et al. ........ 528/272 |
| 5,272,026 A | 12/1993 | Roland et al. | |
| 6,399,273 B1 | 6/2002 | Yamada et al. | |
| 6,875,556 B2 * | 4/2005 | Harada et al. ........ 430/270.1 |

FOREIGN PATENT DOCUMENTS

JP   2000098630   4/2000
KR   10-1998-015678   5/1998

OTHER PUBLICATIONS

CA DN 122:12205 for JP 06073146, Mar. 1994.*

* cited by examiner

Primary Examiner—Amanda Walke
(74) Attorney, Agent, or Firm—Marshall, Gerstein & Borun LLP

(57) ABSTRACT

Photoresist patterns are formed using a photoresist composition, which includes water, a photoacid generator, and a negative photoresist polymer. The polymer includes a basic-type repeating unit represented by Formula (I) (shown below), so that a developing process can be performed not by using conventional TMAH solution but by using water. Additionally, since the main solvent of the composition is water, the disclosed photoresist composition is eco-friendly, and has a low light absorbance at 193 nm and 248 nm, which is useful in a photolithography process using light source in a far ultraviolet region when high-integrated fine circuits of semiconductor device are manufactured.

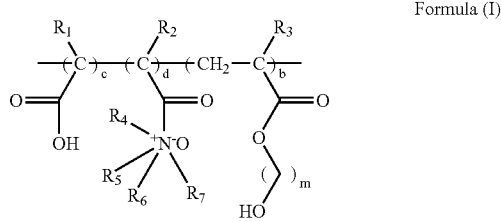

Formula (I)

wherein $R_1$, $R_2$, $R_3$, $R_4$, $R_5$, $R_6$, $R_7$, b, c, d and m are defined in the specification.

21 Claims, 4 Drawing Sheets

WATER-SOLUBLE NEGATIVE PHOTORESIST POLYMER, COMPOSITION CONTAINING THE SAME, AND METHOD OF FORMING A PHOTORESIST PATTERN

BACKGROUND OF THE DISCLOSURE

1. Field of the Disclosure

A water-soluble negative photoresist polymer including a salt-type repeating unit and a photoresist composition containing the same are disclosed. More specifically, a negative photoresist polymer including a salt-type repeating unit, which is used with light sources such as KrF (248 nm), ArF (193 nm) and EUV in formation of photoresist patterns, and a photoresist composition containing the photoresist polymer are disclosed.

2. Description of the Related Technology

According to a conventional photolithography process for forming a photoresist pattern, a photoresist composition is applied on an underlying layer formed on a semiconductor substrate, and baked to form a photoresist film. Next, the photoresist film is exposed and developed, and then rinsed to obtain a photoresist pattern.

The photoresist composition used in the conventional photolithography process has been oil-soluble. In other words, because the photoresist polymer is oil-soluble, organic solvent as a main solvent has been used when a photoresist composition containing the photoresist polymer is fabricated, which results in a serious cause of environmental pollution. In addition, because a tetramethyl ammonium hydroxide (TMAH) aqueous solution or basic aqueous solution is used in the developing process, the photoresist film is required to be additionally cleaned with water in a subsequent process.

SUMMARY OF THE DISCLOSURE

Disclosed herein is a water-soluble, negative photoresist polymer having a repeating unit represented by Formula (I):

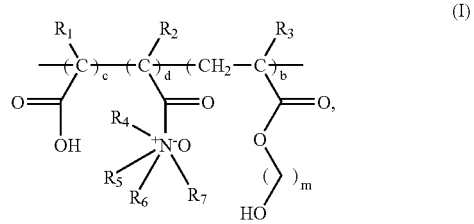

(I)

wherein, $R_1$, $R_2$, $R_3$, $R_4$, $R_5$, $R_6$, and $R_7$ are individually selected from the group consisting of hydrogen, a halogen, $C_1$-$C_{10}$ alkyl, and $CF_3$; the relative ratio (mole percent basis) of b:c:d is 1 to 98:1 to 98:1 to 98; and, m is an integer ranging from 1 to 10.

The polymer is prepared by reacting a basic compound with a polymer having a repeating unit represented by Formula (II):

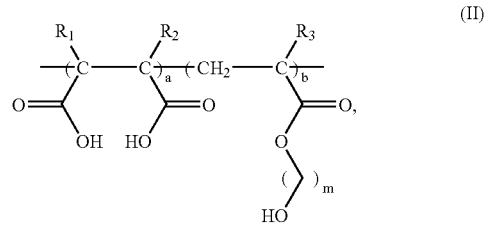

(II)

wherein, $R_1$, $R_2$, and $R_3$ are individually selected from the group consisting of hydrogen, a halogen, $C_1$-$C_{10}$ alkyl, and $CF_3$; the relative ratio (mole percent basis) of a:b is 1 to 99:1 to 99; and, m is an integer ranging from 1 to 10.

Also disclosed herein is a method of forming a photoresist pattern. The method includes coating the photoresist composition described above on an underlying layer of a semiconductor substrate to form a photoresist film, exposing the film to light, and developing the exposed film to obtain a photoresist pattern.

Additional features of the invention may become apparent to those skilled in the art from a review of the following detailed description, taken in conjunction with the drawing figures, the examples, and the appended claims.

BRIEF DESCRIPTION OF THE DRAWINGS

For a more complete understanding of the invention, reference should be made to the following detailed description and accompanying drawings wherein.

Figure 1:
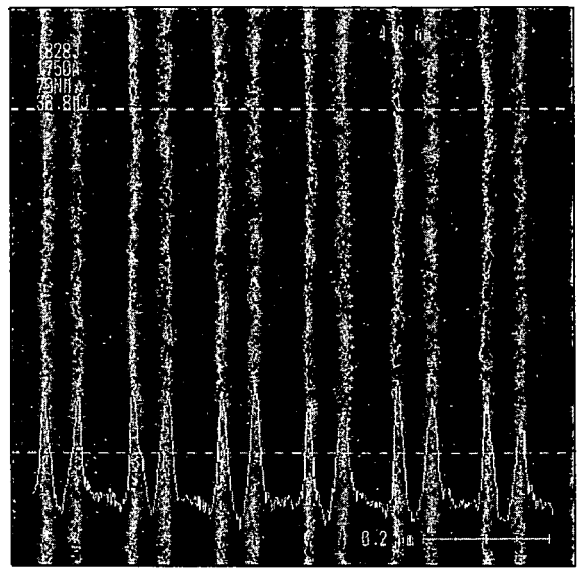
FIG. 1 is a photograph showing a photoresist pattern obtained by carrying out the procedure described in Example 5.

While the disclosed invention is susceptible of embodiments in various forms, there are illustrated in the drawings (and will hereafter be described) specific embodiments of the invention, with the understanding that the disclosure and drawings are intended to be illustrative, and are not intended to limit the invention to the specific embodiments described herein.

DETAILED DESCRIPTION OF THE PREFERRED EMBODIMENTS

Disclosed herein is a water-soluble, negative photoresist polymer comprising a repeating unit represented by Formula (I), shown below. Herein, the repeating units of Formula (I) form a salt type in a branched chain of the part d, so that the polymers containing the above repeating units are water-soluble. The repeating unit of Formula (I) is:

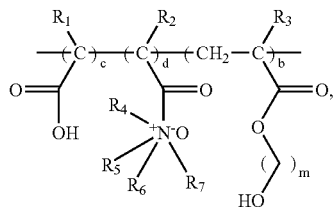

(I)

wherein $R_1$, $R_2$, $R_3$, $R_4$, $R_5$, $R_6$ and $R_7$ are individually selected from the group consisting of hydrogen, a halogen, $C_1$-$C_{10}$ alkyl, and $CF_3$; the relative ratio of b:c:d is 1 to 98 mol %:1 to 98 mol %:1 to 98 mol %; and, m is an integer ranging from 1 to 10. Preferably, the halogen is selected from the group consisting of F, Cl, Br, and I.

Also, there is provided a method for preparing the disclosed water-soluble negative photoresist polymer according to the present invention.

The disclosed water-soluble, negative photoresist polymer is prepared by reacting a basic compound with a polymer including a repeating unit represented by Formula (II):

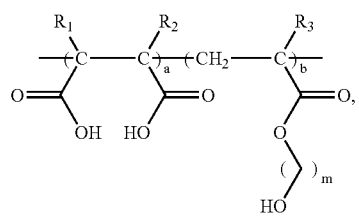

(II)

wherein $R_1$, $R_2$, and $R_3$ are individually selected from the group consisting of hydrogen, a halogen $C_1$-$C_{10}$ alkyl, and $CF_3$; the relative ratio of a:b is 1 to 99 mol %:1 to 99 mol %; and m is an integer ranging from 1 to 10. Preferably, the halogen is selected from the group consisting of F, Cl, Br, and I.

Preferably, the repeating unit of Formula (II) is selected from the group consisting of Formulas (IIa) to (IId):

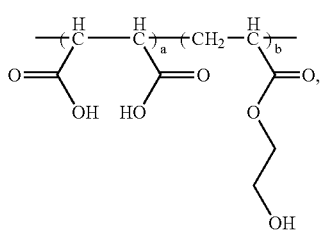

(IIa)

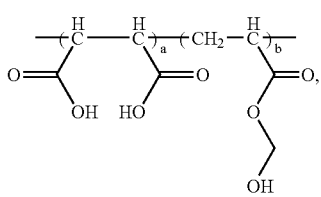

(IIb)

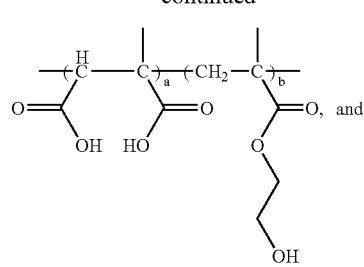

(IIc)

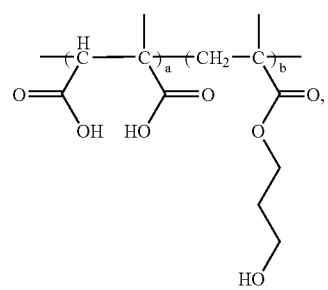

(IId)

wherein the relative ratio of a:b is 1 to 99 mol %:1 to 99 mol %.

Preferably, the basic compound is an amine or ammonium hydroxide.

Additionally, there is provided a photoresist composition comprising a photoresist polymer including a repeating unit represented by Formula (II), a basic compound, water, and a photoacid generator.

Preferably, the disclosed photoresist composition further comprises a $C_1$-$C_{10}$ alcohol to increase solubility of the polymer and the photoacid generator. The $C_1$-$C_{10}$ alcohol preferably is selected from the group consisting of 2-propanol, butylalcohol, 2-methyl-2-butanol, 2-pentanol, 3-pentanol, 1-hexanol, 1-heptanol, and mixtures thereof, and is present in an amount ranging from 1 weight percent (wt. %) to 50 wt. %, based on the weight of water present in the composition.

When the alcohol is less than 1 wt. %, the solubility of the photoresist composition is decreased to precipitate the photoacid generator. When the alcohol is more than 50 wt. %, production cost of the photoresist composition increases. Moreover, the composition is not an eco-friendly material.

Preferably, the photoresist polymer including a repeating unit represented by Formula (II) is present in an amount ranging from 2 wt. % to 30 wt. %, based on the weight of water present in the composition. When the polymer is less than 2 wt. %, the coating ability of the photoresist composition is not sufficient. When the polymer is more than 30 wt. %, the photoresist film becomes thicker, and it requires excessive energy in the exposure process.

Preferably, the basic compound is present in an amount ranging from 0.001 wt. % to 0.1 wt. %, based on the weight of water present in the composition. The amount of the basic compound depends on the amount of carboxylic acid contained in the polymer, including the repeating unit represented by Formula (II). When the basic compound is less than 0.001 wt. %, the solubility of the polymer is lowered, so that the polymer will not dissolve, and acid generated from the photoacid generator after the exposure process is diffused into the unexposed region, thereby causing distortion of patterns. When the basic compound is more than 0.1 wt. %, acid generated in the exposure process is neutralized, so that patterns are not formed.

The photoacid generator is one or more compounds selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, diphenyl p-t-butylphenylsulfonium triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate, phthalimidotrifluoromethane sulfonate, dinitrobenzyltosylate, n-decyl disulfone, and naphthylimido trifluoromethane sulfonate. Preferably, the photoacid generator is present in an amount ranging from 0.5 wt. % to 10 wt. % based on the photoresist polymer including the repeating unit represented by Formula (II). When the photoacid generator is less than 0.5 wt. %, the exposure energy becomes too high. When the photoacid generator is more than 10 wt. %, the absorbance of the photoresist composition increases and the amount of acid generated in the exposed region becomes excessively larger, so that the patterns are distorted.

A method of forming a photoresist pattern, includes (a) coating the disclosed photoresist composition on an underlying layer of a semiconductor substrate to form a photoresist film, (b) exposing the photoresist film to light, and (c) developing the exposed photoresist film to obtain a photoresist pattern.

Preferably, the method may further comprise a soft baking process either before or after the exposing step. The baking process preferably is performed at a temperature ranging from 70° C. to 200° C.

The light of the exposure process is selected from the group consisting of $F_2$ (157 nm), ArF (193 nm), KrF (248 nm), E-beam, EUV (13 nm), and ion-beam, and the exposing step (b) is performed at an exposure energy ranging from 0.1 mJ/cm$^2$ to 100 mJ/cm$^2$.

The reaction mechanism of the disclosed negative photoresist pattern is described through the following Scheme 1.

The polymer including the repeating unit of Formula (II) having a carboxyl group in the part (a) is reacted with an amine or ammonium hydroxide, which is a basic compound, so that the polymer including the repeating unit of Formula (I) is formed. The polymer including the repeating unit of Formula (I) is water-soluble because the repeating unit of Formula (I) forms a salt type in a branched chain of the parts (d).

The polymer including the repeating unit of Formula (I) as a water-soluble, negative photoresist polymer is mixed with the photoacid generator in water as a main solvent, thereby forming a photoresist composition. Moreover, when a photolithography process is performed by using the photoresist composition, the acid generated by light in the exposure process reacts with the polymer (including the repeating unit of Formula (I)) in the baking process after the exposure process, and cross-linked or neutralized, so that it is converted into an insoluble material. As a result, the polymer including the repeating unit of Formula (I) becomes water-insoluble.

Accordingly, the negative photoresist pattern is formed because the photoresist film of the exposed region is not dissolved in water during the developing process using water, while the photoresist film of the unexposed region is dissolved in water.

Scheme 1 is as shown below:

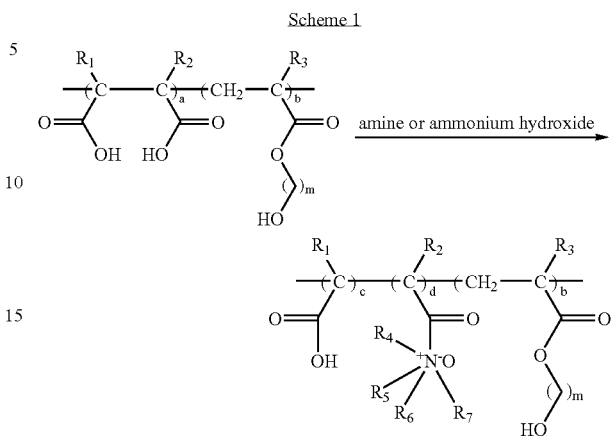

As described above, because the disclosed photoresist polymer is water-soluble, the eco-friendly material, that is, water, can be used instead of any conventional organic solvent. Also, the process is simplified and the cost of production is remarkably reduced because the developing process is performed using water and not by using a basic compound.

In addition, a semiconductor device manufactured using the above-described photoresist composition is also disclosed.

EXAMPLES

The disclosed photoresist polymers and compositions containing the same will be described in detail by referring to examples below, which are not intended to limit the present invention.

I. Preparation of Photoresist Polymer

Example 1

Preparation of Poly(Fumaric Acid/Hydroxyethyl Acrylate)

To 20 g of tetrahydrofuran (THF) were added 5 g of fumaric acid, 5 g of hydroxyethyl acrylate and 0.1 g of 2,2'-azobisisobutylronitrile (AIBN). The resulting mixture was reacted at 67° C. for 3 hours, after which, the resulting solution was dropped in diethylethyl ether, thereby obtaining 9.2 g of a photoresist polymer of Formula (IIa).

Example 2

Preparation of Poly(Fumaric Acid/Hydroxymethyl Acrylate)

To 20 g of THF were added 5 g of fumaric acid, 5 g of hydroxymethyl acrylate and 0.1 g of AIBN. The resulting mixture was reacted at 67° C. for 3 hours, after which, the resulting solution was dropped in diethylethyl ether, thereby obtaining 9.4 g of a photoresist polymer of Formula (IIb).

Example 3

Preparation of Poly(Citraconic Acid/Hydroxyethyl Methacrylate)

To 20 g of tetrahydrofuran (THF) were added 5 g of citraconic acid, 5 g of hydroxyethyl methacrylate and 0.1 g of AIBN. The resulting mixture was reacted at 67° C. for 3 hours, after which, the resulting solution was dropped in diethylethyl ether, thereby obtaining 9.6 g of a photoresist polymer of Formula (IIc).

Example 4

Preparation of Poly(Citraconic Acid/Hydroxypropyl Methacrylate)

To 20 g of THF were added 5 g of citraconic acid, 5 g of hydroxypropyl methacrylate and 0.1 g of AIBN. The resulting mixture was reacted at 67° C. for 3 hours, after which, the resulting solution was dropped in diethylethyl ether, thereby obtaining 9.5 g of a photoresist polymer of Formula (IId).

II. Preparation of Photoresist Composition and Formation of Pattern Using the Same

Example 5

Preparation of Photoresist Composition and Formation of Pattern (1)

To a solution of 20 g of water and 5 g of isopropanol were added 2 g of the photoresist polymer obtained from Example 1, 0.15 g of 20 wt. % tetramethylammonium hydroxide (TMAH) aqueous solution and 0.1 g of triphenylsulfonium triflate, which is a photoacid generator. The resulting mixture was filtered with a 0.20 μm filter, thereby obtaining a disclosed photoresist composition.

The photoresist composition was spin-coated on a silicon wafer, and soft-baked at 130° C. for 90 seconds. After soft-baking, the photoresist film was exposed to light using an ArF laser exposer, and then post-baked at 150° C. for 90 seconds. After post-baking, the wafer was developed in water for 50 seconds to obtain a 70 nm L/S pattern shown in FIG. 1.

Example 6

Preparation of Photoresist Composition and Formation of Pattern (2)

Figure 2:
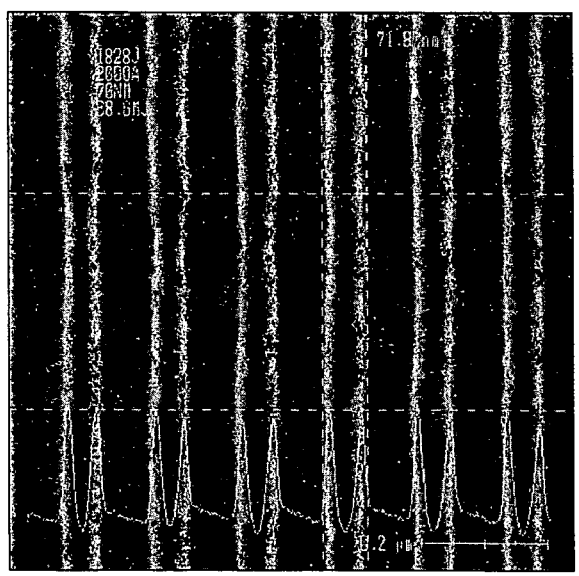
FIG. 2 is a photograph showing a photoresist pattern obtained by carrying out the procedure described in Example 6.

The procedure of Example 5 was repeated using the photoresist polymer of Example 2 (instead of the polymer of Example 1) to obtain a 70 nm L/S pattern shown in FIG. 2.

Example 7

Preparation of Photoresist Composition and Formation of Pattern (3)

Figure 3:
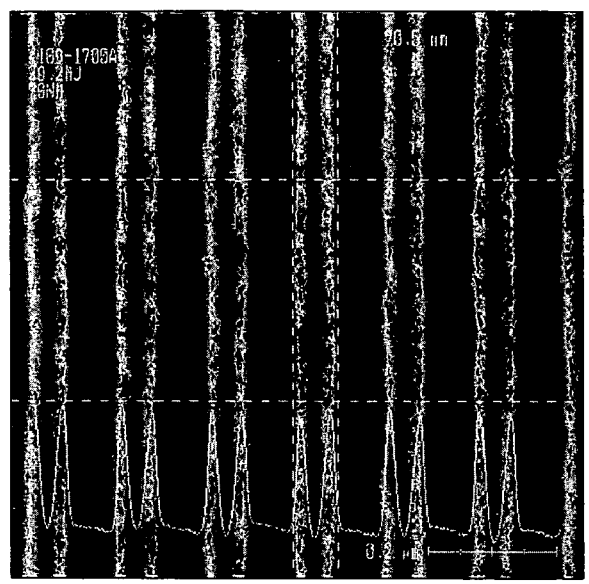
FIG. 3 is a photograph showing a photoresist pattern obtained by carrying out the procedure described in Example 7; and, FIG. 4 is a photograph showing a photoresist pattern obtained by carrying out the procedure described in Example 8.

The procedure of Example 5 was repeated using the photoresist polymer of Example 3 (instead of the polymer of Example 1) to obtain a 70 nm L/S pattern shown in FIG. 3.

Example 8

Preparation of Photoresist Composition and Formation of Pattern (4)

Figure 4:
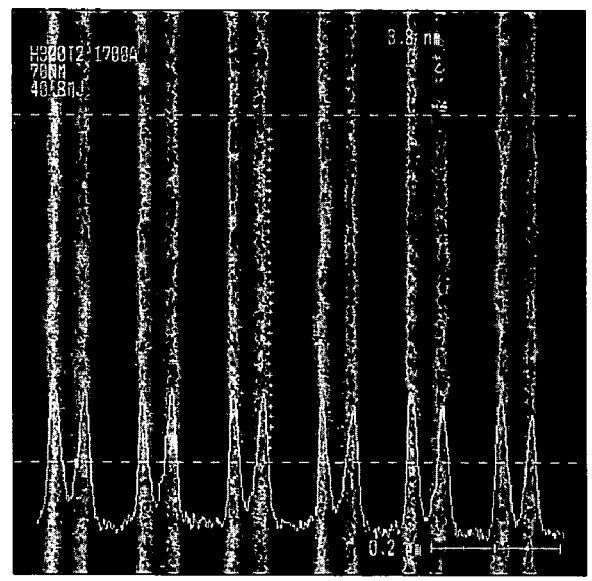
Figure 5:
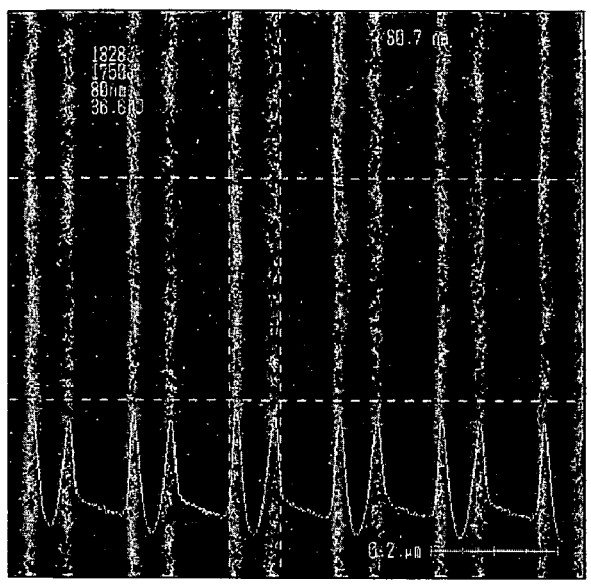
Figure 6:
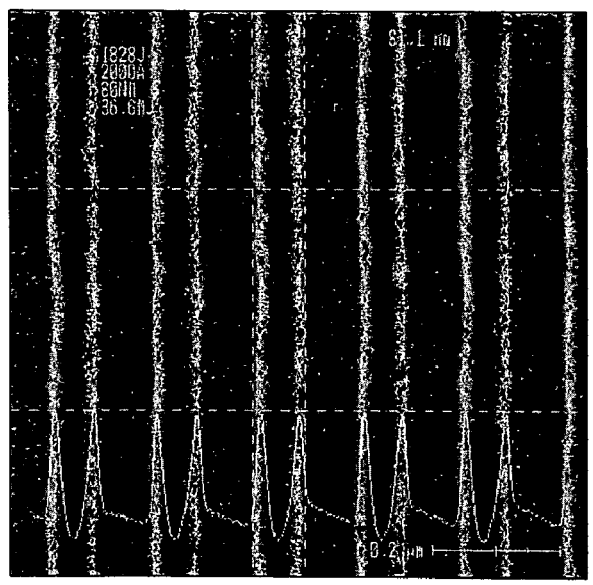
Figure 7:
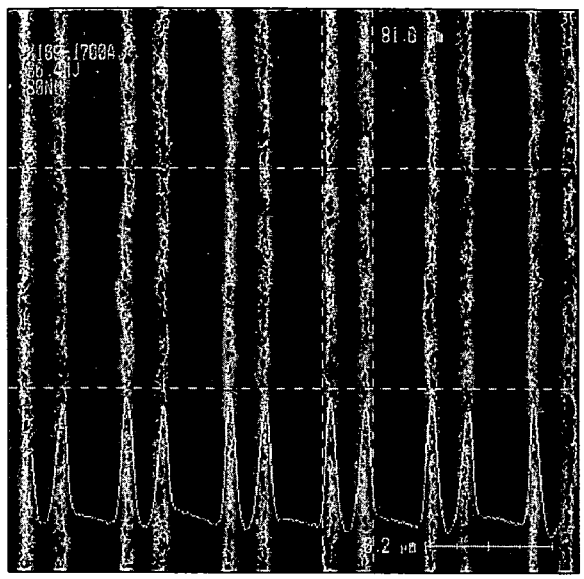
Figure 8:
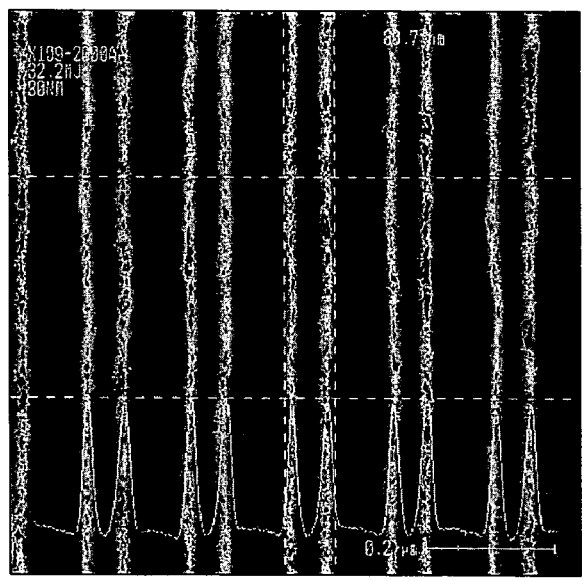

The procedure of Example 5 was repeated using the photoresist polymer of Example 4 (instead of the polymer of Example 1) to obtain a 70 nm L/S pattern shown in FIG. 4.

As discussed earlier, photoresist patterns are formed using the disclosed photoresist composition, which includes water, a photoacid generator and a negative photoresist polymer having a basic-type repeating unit, so that a developing process can be performed with water instead of a conventional TMAH solution. Additionally, since the main solvent of the composition is water, the disclosed photoresist composition is eco-friendly, and has a low light absorbance at 193 nm and 248 nm, which is useful in a photolithography process using light source in a far ultraviolet region when high-integrated fine circuits of semiconductor device are manufactured.

The foregoing description is given for clearness of understanding only, and no unnecessary limitations should be understood therefrom, as modifications within the scope of the invention may be apparent to those having ordinary skill in the art.

What is claimed is:

1. A water-soluble, negative photoresist polymer comprising a repeating unit represented by Formula (I):

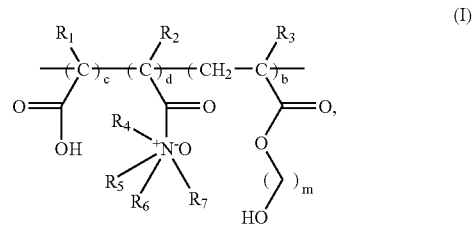

(I)

wherein $R_1$, $R_2$, $R_3$, $R_4$, $R_5$, $R_6$ and $R_7$ are individually selected from the group consisting of hydrogen, a halogen, $C_1$-$C_{10}$ alkyl, and $CF_3$;

the relative ratio of b:c:d is 1 to 98 mol %:1 to 98 mol %:1 to 98 mol %; and, m is an integer ranging from 1 to 10.

2. A method of preparing the polymer of claim 1, the method comprising reacting a basic compound with a polymer having a repeating unit represented by Formula (II):

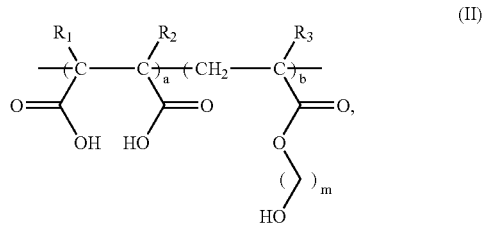

(II)

wherein $R_1$, $R_2$, and $R_3$ are individually selected from the group consisting of hydrogen, a halogen, $C_1$-$C_{10}$ alkyl, and $CF_3$;

the relative ratio of a:b is 1 to 99 mol %:1 to 99 mol %; and, m is an integer ranging from 1 to 10.

3. The method of claim 2, wherein the repeating unit of Formula II is selected from the group consisting of Formulas (IIa) to (IId):

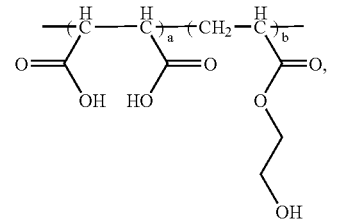
(IIa)

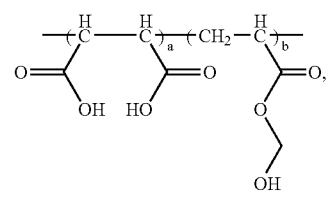
(IIb)

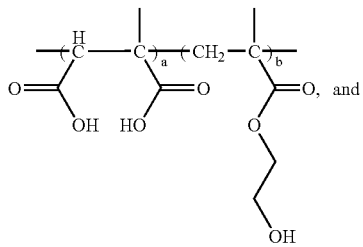
(IIc)

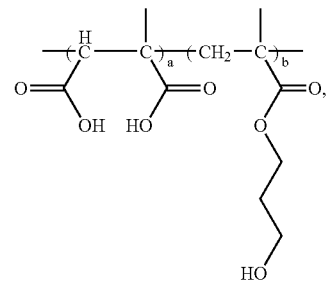
(IId)

wherein the relative ratio of a:b is 1 to 99 mol %:1 to 99 mol %.

4. The method of claim 2, wherein the basic compound is an amine or ammonium hydroxide.

5. A photoresist composition comprising water, a photoacid generator, and a water-soluble, negative photoresist polymer comprising a repeating unit represented by formula I:

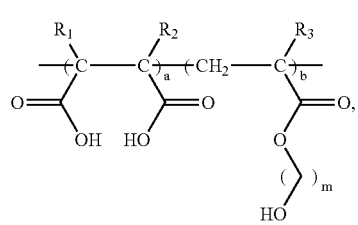
(II)

wherein $R_1$, $R_2$, $R_3$, $R_4$, $R_5$, $R_6$ and $R_7$ are individually selected from the group consisting of hydrogen, a halogen, $C_1$-$C_{10}$ alkyl, and $CF_3$;

the relative ratio of b:c:d is 1 to 98 mol %:1 to 98 mol %:1 to 98 mol %; and, m is an integer ranging from 1 to 10.

6. The photoresist composition of claim 5, further comprising a $C_1$-$C_{10}$ alcohol.

7. The photoresist composition of claim 6, wherein the $C_1$-$C_{10}$ alcohol is selected from the group consisting of 2-propanol, butyl alcohol, 2-methyl-2-butanol, 2-pentanol, 3-pentanol, 1-hexanol, 1-heptanol, and mixtures thereof.

8. The photoresist composition of claim 6, wherein the $C_1$-$C_{10}$ alcohol compound is present in an amount ranging from 1 wt. % to 50 wt. %, based on the weight of water present in the composition.

9. The photoresist composition of claim 5, wherein the photoresist polymer is present in an amount ranging from 2 wt. % to 30 wt. %, based on the weight of water present in the composition.

10. The photoresist composition of claim 5, wherein the photoacid generator is one or more compounds selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, diphenyl p-t-butylphenylsulfonium triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate, phthalimidotrifluoromethane sulfonate, dinitrobenzyltosylate, n-decyl disulfone, and naphthylimido trifluoromethane sulfonate.

11. The photoresist composition of claim 5, wherein the photoacid generator is present in an amount ranging from 0.5 wt. % to 10 wt. %, based on the weight of the photoresist polymer present in the composition.

12. A method of forming a photoresist pattern, the method comprising:

(a) coating the photoresist composition of claim 5 on an underlying layer of a semiconductor substrate to form a photoresist film;

(b) exposing the photoresist film to light; and, (c) developing the exposed photoresist film to obtain a photoresist pattern.

13. The method of claim 12, further comprising a soft baking process before the exposing step (b) or a post baking process after exposing the step (b).

14. The method of claim 13, wherein the baking process is performed at a temperature ranging from 70° C. to 200° C.

15. The method of claim 12, wherein the light of the step (b) is selected from the group consisting of $F_2$ (157 nm), ArF (193 nm), KrF (248 nm), E-beam, EUV(13 nm), and ion beam.

16. The method of claim 12, wherein the exposing step (b) is performed at an exposure energy ranging from 0.1 mJ/cm$^2$ to 100 mJ/cm$^2$.

17. photoresist composition comprising a basic compound, water, a photoacid generator, and a photoresist polymer having a repeating unit represented by Formula II:

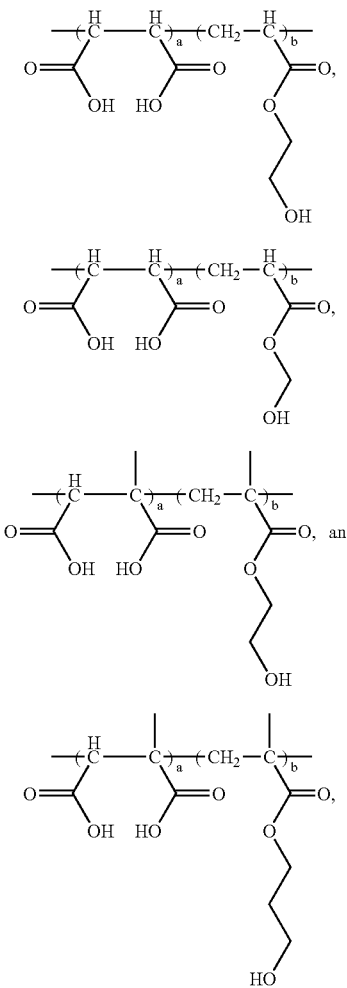

wherein
R₁, R₂, and R₃ are individually selected from the group consisting of hydrogen, a halogen, $C_1$-$C_{10}$ alkyl, and $CF_3$;
the relative ratio of a:b is 1 to 99 mol %:1 to 99 mol %; and,
m is an integer ranging from 1 to 10.

18. The photoresist composition of claim 5, wherein the water-soluble, negative photoresist polymer is obtained by reacting a photoresist polymer having a repeating unit represented by Formula II:

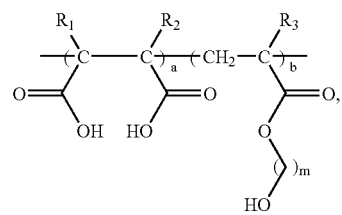

wherein R₁, R₂, and R₃ are individually selected from the group consisting of hydrogen, a halogen, $C_1$-$C_{10}$ alkyl, and $CF_3$;
the relative ratio of a:b is 1 to 99 mol %:1 to 99 mol %; and,
m is an integer ranging from 1 to 10 with a basic compound.

19. The photoresist composition of claim 18, wherein the repeating unit of Formula (II) is selected from the group consisting of Formulas (IIa) to (IId):

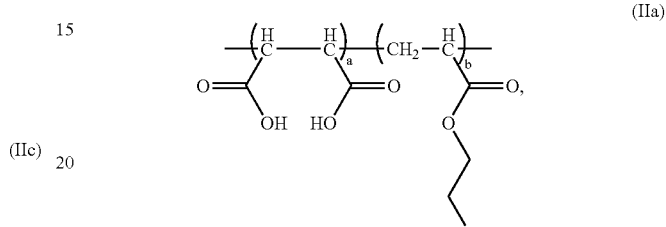

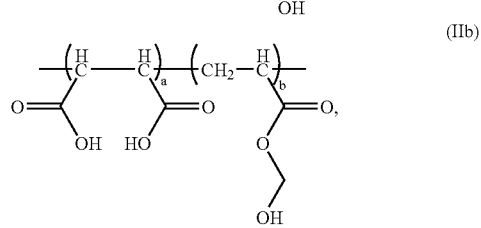

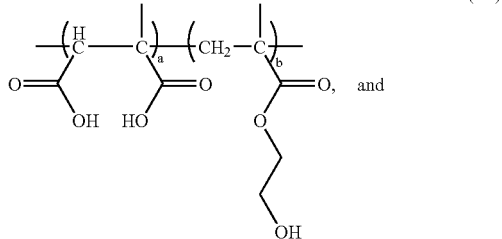

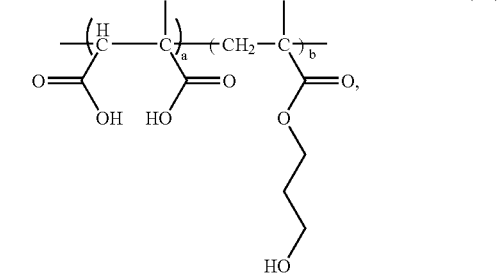

wherein the relative ratio of a:b is 1 to 99 mol %:1 to 99 mol %.

20. The photoresist composition of claim 18, wherein the basic compound is an amine or an ammonium hydroxide.

21. The photoresist composition of claim 18, wherein the basic compound is present in an amount ranging from 0.001 wt. % to 0.1 wt. %, based on the weight of water present in the composition.

* * * * *